Figure 1:
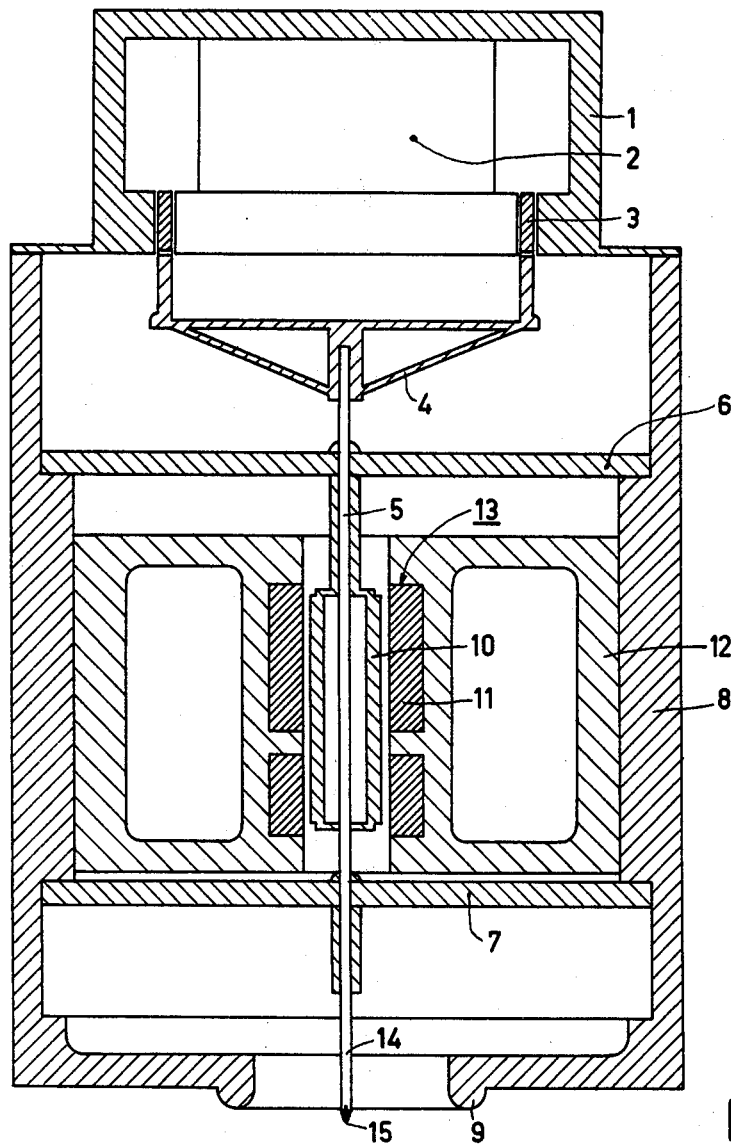
Figure 2:
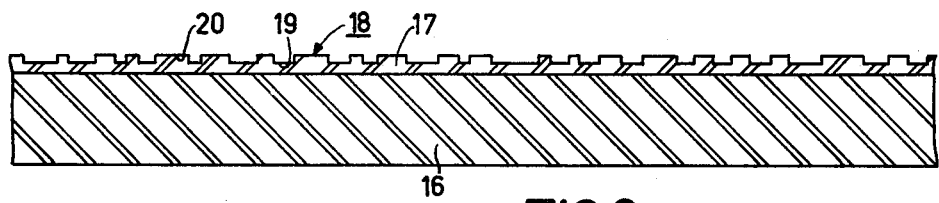

United States Patent [19]

vanden Broek et al.

[11] 4,410,978
[45] Oct. 18, 1983

[54] OPTICALLY READABLE INFORMATION DISK

[75] Inventors: Arnoldus J. M. vanden Broek; Petrus E. J. Legierse; Henricus D. M. Ribberink, all of Eindhoven, Netherlands

[73] Assignee: U.S. Philips Corporation, New York, N.Y.

[21] Appl. No.: 310,684

[22] Filed: Oct. 13, 1981

[30] Foreign Application Priority Data

Oct. 15, 1980 [NL] Netherlands .................... 8005674

[51] Int. Cl.³ .............................................. B32B 3/02
[52] U.S. Cl. ................................. 369/275; 428/64; 428/65; 369/284; 369/288
[58] Field of Search .............. 427/764, 165; 369/283, 369/284, 286, 288, 275; 428/64, 65

[56] References Cited

U.S. PATENT DOCUMENTS

| | | | |
|---|---|---|---|
| 4,125,654 | 11/1978 | Kaneko et al. | 369/288 |
| 4,188,433 | 2/1980 | Dijkstra et al. | 369/288 |
| 4,272,544 | 6/1981 | Lippits et al. | 428/64 |
| 4,318,112 | 3/1982 | Kivits et al. | 369/284 |

FOREIGN PATENT DOCUMENTS

| | | | |
|---|---|---|---|
| 2639222 | 3/1978 | Fed. Rep. of Germany | 369/286 |
| 2853262 | 4/1978 | Fed. Rep. of Germany | 369/284 |
| 55-157107 | 12/1980 | Japan | 369/283 |

Primary Examiner—James J. Bell
Attorney, Agent, or Firm—Norman N. Spain

[57] ABSTRACT

Optionally readable information disk in which the information track is situated in a radiation-cured lacquer layer comprising at least 50% by weight of a diacrylate, triacrylate or a mixture thereof and which the cured lacquer layer has a high indentation hardness.

5 Claims, 2 Drawing Figures

OPTICALLY READABLE INFORMATION DISK

BACKGROUND OF THE INVENTION

The invention relates to an optically readable information disk which comprises a substrate plate having at least on one side a radiation-cured lacquer layer in which an information track of information regions situated at a higher and a lower level is provided and is covered with a reflecting layer.

Such a disk is known from the published Netherlands Patent Application No. 76 11 395 in the name of Applicants.

Applicants have found that the known information disks have a considerably worse signal-to-noise ratio, abbreviation SNR, than the master plate from which the disks are derived. The master plate is a flat glass plate which is covered on one side with a photoresist layer in which the information track has been provided by exposure to laser light succeeded by photochemical development. First metal copies, the so-called father disks, are made from the master plate electrochemically and by electro-deposition, from which father plates, subsequently second metal copies, also called mother disks, are made by electro-deposition and therefrom third and subsequent metal copies are manufactured. The last copies of the "family" are termed dies.

The above-mentioned optically readable information disks are manufactured by means of the dies in which the surface of the die in which the information track is present is provided with a thin layer of a lacquer which is curable by radiation, for example ultraviolet light, the substrate plate is then provided thereon, the assembly is exposed via the substrate plate and the resulting disk comprising the substrate plate and the cured lacquer layer connected thereto in which the information track is copied, is finally removed from the die. The cured lacquer layer is provided with a reflecting layer, for example, a vapour-deposited layer of aluminum or silver, on the side of the information track.

The information regions present in the information track have very small dimensions. The longitudinal dimensions vary in accordance with the stored information from approximately 0.3-3 $\mu$m. The difference in height between the regions mutually corresponds to a quarter wavelength (or a multiple thereof) of the laser light with which the disk is read optically and amounts to 1-2 $\mu$m. The disk is read in reflection via the substrate plate in which the detection of the information regions is based on phase differences occurring between the forward and the reflected laser light beam.

In the steps leading from the master to die and the subsequent production of the optically readable disk starting with the provision of a light-curable lacquer on the die and up to the vapour deposition of a reflecting layer, all kinds of errors and deviations may occur as a result of which the quality of the finished disk is diminished, in particular a deterioration in the signal-to-noise ratio with respect to that of the master.

SUMMARY OF THE INVENTION

It is the object of the present invention to reduce this loss of signal-to-noise ratio considerably and hence to improve the quality, in particular the quality of the stored information in the optically readable information disk.

According to the invention this object is achieved with an information disk of the type mentioned in the opening paragraph which is characterized in that the lacquer layer has a minimum indentation hardness which corresponds to a maximum penetration depth of 5 $\mu$m of a needle which is placed on the lacquer layer and which comprises a ball-shaped tip manufactured from hard material and having a diameter of $18 \pm 1$ $\mu$m and presses on the lacquer with a weight of $2.5 \pm 0.1$ gram.

Favourable results are achieved with an information disk the lacquer layer of which has an indentation hardness which corresponds to a penetration depth of 1.5-3.0 $\mu$m.

The desired hardness of the lacquer layer can be obtained by a suitable choice of the ingredients of a radiation-curable lacquer which, after exposure, for example, to ultraviolet light, provides the cured lacquer layer. In this case it holds that those skilled in the art must make such a choice from the commercially available lacquers or lacquer components that the lacquer per unit by volume comprises a large number of cross-linkable groups so that after curing a large number of cross-links is formed. More in particular there must preferably be started from a curable lacquer which comprises components which per molecule have two or more cross-linkable groups which hereinafter also are termed functional groups. Herewith it is achieved that upon curing in addition to linear polymerization, many cross-links are realized which lead to a network structure.

Particularly suitable are radiation-curable lacquers comprising at least 50% by weight of a diacrylate, a triacrylate or a mixture thereof.

Di- and triacrylates comprise respectively two and three functional groups, in this case ethene groups, per molecule. Examples of such acrylates are alkanedioldiacrylates, such as 1,3-propanedioldiacrylate, 1,5-butanedioldiacrylate and 1,6-hexanedioldiacrylate, alkeneglycoldiacrylates, such as diethyleneglycoldiacrylate, triethyleneglycoldiacrylate and tripropyleneglycoldiacrylate, as well as trimethylolpropanetriacrylate, pentacrythritoltriacrylate and pentaerythritolpropylethertriacrylate.

The lacquer also comprises a usual photosensitive catalyst such as an aromatic carbonyl compound, for example, benzoinisobutylether or a ketal, for example, benzildimethylketal, in a quantity from approximately 1 to 5% by weight.

In a preferred embodiment the diacrylate, triacrylate or a mixture thereof used in the radiation-curable lacquer has an average molecular weight from 200 to 350. The very good results which are obtained by using said lacquer may simply be called striking. It may be expected that the comparatively low-molecular products will show a comparatively high shrinkage upon curing so that the results are influenced only negatively. The opposite is the case which, in Applicants opinion, is caused by the comparatively low viscosity of the lacquer (smaller than 30 cP) so that very thin layers can be realized in a thickness smaller than 50 $\mu$m, for example 20-35 $\mu$m. As a result of this absolute shrinkage is small. It is further believed that due to the low viscosity the mobility of the molecules not yet polymerized during the curing process is still sufficient to fill up the space between the lacquer layer and the information track present in the die arisen from shrinkage. The thickness of the cured lacquer layer then becomes slightly smaller but this has no influence on the signal-to-noise ratio.

The low viscosity has furthermore for its result that the radiation-curable lacquer can more easily be distributed over the die surface, while the possibility of air bubble inclusion is smaller.

TABLE-continued

| | | | |
|---|---|---|---|
| 3 | Al | 2.2 | 0.5 |
| 4 | Ag | 2.6 | 1.2 |
| 4 | Al | 2.6 | 1.5 |
| 5 | Ag | 9.0 | 8.2 |
| 5 | Al | 9.0 | 6.0 |

Composition of the lacquers

| lacquer No. 1: | 64 | wt. % | pentaerythritolpropylethertriacrylate |
|---|---|---|---|
| | 16 | wt. % | N—vinylpyrrolidone |
| | 16 | wt. % | hexanedioldiacrylate |
| | 4 | wt. % | benzildimethylketal |
| lacquer No. 2: | 78 | wt. % | tripropyleneglycoldiacrylate |
| | 20 | wt. % | N—vinylpyrrolidone |
| | 2 | wt. % | benzildimethylketal |
| lacquer No. 3: | 58 | wt. % | tripropyleneglycoldiacrylate |
| | 28 | wt. % | N—vinylpyrrolidone |
| | 10 | wt. % | trimethylolpropanetriacrylate |
| | 4 | wt. % | benzildimethylketal |
| lacquer No. 4: | 78 | wt. % | ethoxylated trimethylolpropane triacrylate (koskydal K-5-2445) |
| | 20 | wt. % | N—vinylpyrrolidone |
| | 2 | wt. % | benzoin-isobutylether |
| lacquer No. 5: | 59 | wt. % | 2-ethylhexylacrylate |
| | 19.5 | wt. % | butanedioldiacrylate |
| | 19.5 | wt. % | trimethylolpropanetriacrylate |
| | 2 | wt. % | benzoin-isobutylether |

What is claimed is:

1. An optically readable information disk which comprises a substrate plate having on at least one side a radiation-cured lacquer layer in which an information track of information regions situated at a higher and a lower level is provided and is covered with a reflective layer, characterized in that the cured lacquer layer has a minimum indentation hardness which corresponds to a maximum depth of penetration of 5 um of a needle which is placed on the lacquer layer and which has a ball-shaped tip manufactured from a hard material and having a diameter of $18\pm1$ um and presses on the layer with a weight of $2.5\pm0.1$ g and is manufactured from a radiation-curable lacquer comprising at least 50% by weight of a diacrylate, triacrylate or a mixture thereof.

2. An information disk as claimed in claim 1, characterized in that the cured lacquer layer has an indentation hardness which corresponds to a depth of penetration of 1.5–3.0 $\mu$m.

3. An information disk as claimed in claim 1, characterized in that the diacrylate, triacrylate or the mixture thereof has an average molecular weight of 200–350.

4. An information disk as claimed in claim 3, characterized in that the radiation-curable lacquer also comprises a monofunctional compound.

5. An information disk as claimed in claim 4, characterized in that the monofunctional compound is N-vinylpyrrolidone.

* * * * *